(12) United States Patent
Keller et al.

(10) Patent No.: US 6,714,766 B1
(45) Date of Patent: Mar. 30, 2004

(54) CIRCUIT ASSEMBLY FOR PRODUCING A ONE-WAY CONNECTION BETWEEN TRANSMITTER AND/OR RECEIVER UNITS AND AN ANTENNA

(75) Inventors: Thomas Keller, Freising (DE); Manfred Plankensteiner, Germering (DE)

(73) Assignee: Texas Instruments Incorporated, Dallas, TX (US)

( * ) Notice: Subject to any disclaimer, the term of this patent is extended or adjusted under 35 U.S.C. 154(b) by 453 days.

(21) Appl. No.: 09/685,181

(22) Filed: Oct. 11, 2000

(30) Foreign Application Priority Data

Oct. 11, 1999 (DE) .......................................... 199 48 964

(51) Int. Cl.[7] .................................................. H04B 1/44
(52) U.S. Cl. ........................................ 455/78; 333/101
(58) Field of Search .............................. 455/78, 80, 81, 455/82, 83; 370/276, 278; 333/101, 104, 112

(56) References Cited

U.S. PATENT DOCUMENTS 5,193,218 A * 3/1993 Shimo .......................... 455/80
6,087,998 A * 7/2000 Nguyen et al. ............... 455/82

* cited by examiner

Primary Examiner—Lee Nguyen
(74) Attorney, Agent, or Firm—W. Daniel Swayze, Jr.; W. James Brady; Frederick J. Telecky, Jr.

(57) ABSTRACT

In a circuit assembly for producing a one-way connection between a first transmitter or receiver (12) operating on a first frequency and an antenna (16), on the one hand, as well as between a second transmitter or receiver (14) operating on a second frequency and the antenna (16) on the other, each transmitter or receiver having a port for producing a connection to the antenna (16) a filter (18) is used having at least one symmetrical port, the passband of which covers the first and the second frequency, whereby the antenna (16) is connected to one of the ports of the filter (18). A first passive network (24) between one lead of the at least one symmetrical port of the filter (18) and the input of the first transmitter or receiver (12) short-circuits at the second frequency the port (20) of the first transmitter or receiver (12). A second passive network (26) between the other lead of the at least one symmetrical port of the filter (18) and the port (22) of the second transmitter or receiver (14) short-circuits the port (22) of the second transmitter or receiver (14) at the first frequency.

4 Claims, 1 Drawing Sheet

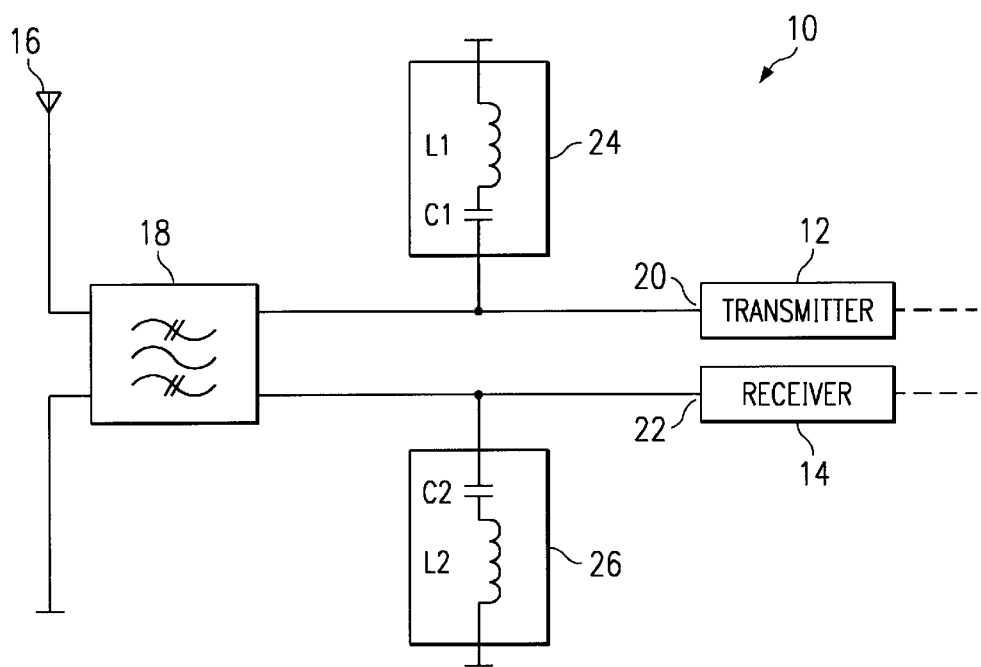

CIRCUIT ASSEMBLY FOR PRODUCING A ONE-WAY CONNECTION BETWEEN TRANSMITTER AND/OR RECEIVER UNITS AND AN ANTENNA

The invention relates to a circuit assembly for producing a one-way connection between a first transmitter or receiver operating on a first frequency and an antenna, on the one hand, as well as between a second transmitter or receiver operating on a second frequency and the antenna, on the other, each transmitter or receiver having a port for producing a connection to the antenna.

When several transmitters and/or receivers are connected to an antenna for radiating transmission signals via the antenna or receiving reception signals via the antenna, a connection needs to be made only between the transmitter and/or receiver in operation at the time and the antenna whilst the other units are disconnected from the antenna and remaining units. The classic case in such an arrangement is the connection of an antenna to a transmitter and to a receiver, this connection being made via an antenna diplexer which in the transmission mode ensures a connection exists only between the transmitter and the antenna, whilst in the receiving mode it connects only the receiver to the antenna. This selection or disconnection function is conventionally done with the aid of diode switches signalled ON/OFF by separate control signals. These diode switches complicate the circuitry required for the control.

One aspect of the invention is based on the object of configuring a circuit assembly of the aforementioned kind which achieves the desired selection or disconnection effect between the units to be connected to/disconnected from the antenna in each case exclusively by passive means.

In accordance with this aspect of the invention this object is achieved by a filter having at least one symmetrical port, the passband of which covers the first and the second frequency, whereby the antenna is connected to one of the ports of the filter, a first passive network between one lead of the at least one symmetrical port of the filter and the port of the first transmitter or receiver which short-circuits at the second frequency the input of the first transmitter or receiver, and a second passive network between the other lead of the at least one symmetrical port of the filter and the port of the second transmitter or receiver which short-circuits the input of the second transmitter or receiver at the first frequency.

In the circuit assembly in accordance with an aspect of the invention a filter comprising at least one symmetrical port is inserted between the antenna and the transmitters and/or receivers. This configuration of the filter permits connecting one unit to the one lead of the symmetrical port and the other unit to the other lead of the symmetrical port. The passive networks connected by the leads of the symmetrical ports of the filter ensure that, depending on the frequency existing at the time, the one or the other unit is connected to the antenna, whereby the connection of the other unit in each case is short-circuited so that it is disconnected. By using passive networks no separate circuiting means are needed in addition to make the desired connection of the unit in operation at the time to the antenna whilst simultaneously disconnecting the other unit from the antenna.

Advantageous further embodiments of the invention are characterized in the sub-claims.

A preferred aspect is a transmitter and the other unit is a receiver, the combination of the filter with the symmetrical port and the passive networks handles the classic task of an antenna diplexer which ensures that only the unit in operation at the time is connected to the antenna whilst the other unit is disconnected. In another preferred aspect the passive networks are simple series resonance circuits which are simple to realize and which require no extra circuitry for their control.

The invention will now be detained by way of an example with reference to the drawing in which the sole FIGURE shows a preferred embodiment of the circuit assembly in accordance with the invention.

The circuit assembly 10 as shown in the drawing contains a transmitter 12 operating at a first frequency, as well as a receiver 14 operating at a second frequency. Such units are contained, for example, as circuit modules in every mobile telephone capable of transmitting and receiving signals.

In the circuit assembly 10 a common antenna 16 is used both for transmitting and receiving the signals, the antenna being connected via a filter 18 to the transmitter 12 and receiver 14. This filter 18 is a band filter passing a frequency range which contains the first frequency used by the transmitter and the second frequency used by the receiver. The filter 18 is a filter having symmetrical ports, the one lead of the one symmetrical port being connected to the antenna, the other being connected to ground. With the other lead of the second symmetrical port the transmitter 12 is connected whilst the receiver 14 is connected to the other lead of this symmetrical port.

As evident from the drawing a passive network 24 or 26 is connected between the output port 20 of the transmitter and the input port 22 of the receiver, each passive network in the present aspect as described comprising a series resonance circuit of a capacitor C1 and an inductance L1 or of a capacitor C2 and an inductance L2. Each end of the inductance not connected to the capacitor is connected to ground.

The values of the capacitor C1 and of the inductance L1 are selected so that the resonant frequency of the series resonance circuit formed by these components equals the second frequency at which the receiver 14 works. The values of the capacitor C2 and of the inductance L2 are selected so that the resonant frequency of the series resonance circuit formed by these components equals the first frequency at which the transmitter 12 works.

By selecting the resonant frequencies of the two passive networks 24 and 26 in this way the following response of the circuit assembly as described is achieved: when the transmitter 12 is working it outputs at its output port 20 a signal having the first frequency which is passed by the filter 18 to the antenna 16. The series resonance circuit comprising the capacitor C1 and the inductance L1 is not in resonance so that only a very high-impedance connection exists between the output port 20 and ground, thus resulting in the transmitter and/or receiver of the signal output by the transmitter 12 to the antenna 16 being influenced only insignificantly; whereas the series resonance circuit formed by the capacitor C2 and inductance L2 is in resonance, resulting in a short-circuit existing between the input port 22 of the receiver 14 and ground and thus no signal having the first frequency can pass to the input port 22 of the receiver 14.

Should the antenna 16 receive signals having the second frequency which thus gain access to the receiver 14, these signals are passed by the filter 18 to the input port 22 of the receiver 14, since in this case the series resonance circuit formed by the capacitor C2 and inductance L2 is not in resonance, i.e. has a very high-impedance so that the connection between the antenna and the input port 22 is hardly affected. The series resonance circuit of the capacitor C1 and the inductance L1 is at the second frequency in resonance, however, so that the output port 20 of the transmitter 12 is short-circuited to ground and thus the receiver signals are unable to attain the output port 20 of the transmitter 12.

The two passive networks 24 and 26 thus assume the function of an antenna diplexer making the connection between the unit 12 or 14 working at the time and the antenna, depending on which frequency is being used at the time.

The requirement for the function as described is use of a filter 18 having at least one symmetrical port for the connection to the transmitter and the receiver 14. One such filter is for example a SAW filter as made and sold for example by the company S+M Components as type designation B4678.

In the above example a transmitter 12 and a receiver 14 are connected to the filter 18. However, it will readily be appreciated, if the application requires, that also two transmitters or two receivers may be connected, each of which works with a different frequency so that depending on the operating frequency in each case the one or the other unit is connected to the antenna 16.

The circuit assembly 10 as described is achievable by very simple means and necessitates no additional means whatsoever, e.g. for generating separate control signals for the desired selection of a unit connected to the filter 18.

What is claimed is:

1. A circuit assembly for producing a one-way connection between a first transmitter or receiver operating on a first frequency and an antenna, on the one hand, as well as between a second transmitter or receiver operating on a second frequency and the antenna on the other, each transmitter or receiver having a port for producing a connection to the antenna, comprising a filter (18) having at least one symmetrical port, the passband of which covers said first and the second frequency, whereby said antenna (16) is connected to one of said ports of said filter (18), a diplexer including a first passive network (24) between one lead of said at least one symmetrical port of said filter (18) and said port (20) of said first transmitter or receiver (12) which short-circuits at said second frequency the input (20) of said first transmitter or receiver (12), and having a second passive network (26) between said other lead of said at least one symmetrical port of said filter (18) and said port of said second transmitter or receiver (14) which short-circuits the input (22) of said second transmitter or receiver (14) at said first frequency.

2. The circuit assembly as set forth in claim 1, wherein a transmitter (12) is connected to the one lead of said at least one symmetrical port of said filter (18) and a receiver (14) is connected to the other lead of said at least one symmetrical port of said filter (18), a one-way connection existing between said transmitter (12) and said antenna (16), and said port (22) of said receiver (14) is short-circuited when said transmitter (12) is operating at said first frequency, a one-way connection between said antenna (16) and said receiver (14), and said port (20) of said transmitter (12) is short-circuited when said receiver (14) is operating at said second frequency.

3. The circuit assembly as set forth in claim 2 wherein said passive networks (24, 26) are series resonance circuits (C1, L1; C2, L2), each of which is connected between said leads of said symmetrical port of said filter (18) and ground, the resonant frequency of the one series resonance circuit (C2, L2) corresponds to the first frequency, and the resonant frequency of the other series resonance circuit (C1, L1) corresponds to the second frequency.

4. The circuit assembly as set forth in claim 1 wherein said first and second passive networks (24, 26) are series resonance circuits (C1, L1; C2, L2), each of which is connected between said leads of said symmetrical port of said filter (18) and ground, the resonant frequency of the one series resonance circuit (C2, L2) corresponds to the first frequency, and the resonant frequency of the other series resonance circuit (C1, L1) corresponds to the second frequency.

* * * * *